United States Patent
Bertin et al.

(10) Patent No.: US 6,396,120 B1
(45) Date of Patent: May 28, 2002

(54) SILICON ANTI-FUSE STRUCTURES, BULK AND SILICON ON INSULATOR FABRICATION METHODS AND APPLICATION

(75) Inventors: Claude L Bertin, South Burlington; Toshiharu Furukawa; Erik L. Hedberg, both of Essex Junction, all of VT (US); Jack A. Mandelman, Stormville, NY (US); William R. Tonti; Richard Q. Williams, both of Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/527,191

(22) Filed: Mar. 17, 2000

(51) Int. Cl.$^7$ ............................................. H01L 29/72
(52) U.S. Cl. ....................... 257/530; 257/627; 257/773
(58) Field of Search ............................ 257/530, 627, 257/773

(56) References Cited

U.S. PATENT DOCUMENTS

| | | | |
|---|---|---|---|
| 4,476,478 A | * 10/1984 | Noguchi et al. | ............ 257/530 |
| 5,166,556 A | * 11/1992 | Hsu et al. | ................... 257/530 |
| 5,250,459 A | 10/1993 | Lee | |
| 5,304,508 A | 4/1994 | Cohen | |
| 5,314,840 A | 5/1994 | Schepis et al. | |
| 5,469,109 A | 11/1995 | Paivinen | |
| 5,485,032 A | 1/1996 | Schepis et al. | |
| 5,572,062 A | * 11/1996 | Iranmanesh | ................. 257/530 |
| 5,672,994 A | 9/1997 | Au et al. | |
| 5,774,011 A | 6/1998 | Au et al. | |
| 5,804,500 A | 9/1998 | Hawley et al. | |
| 5,811,870 A | 9/1998 | Bhattacharyya et al. | |
| 5,904,507 A | 5/1999 | Thomas | |

* cited by examiner

*Primary Examiner*—Edward Wojciechowicz
(74) *Attorney, Agent, or Firm*—Whitham, Curtis & Christofferson, P.C.; Mark F. Chadurjian

(57) ABSTRACT

A method and semiconductor structure that uses a field enhanced region where the oxide thickness is substantially reduced, thereby allowing antifuse programming at burn-in voltages which do not damage the standard CMOS logic. The semiconductor device comprises a substrate that has a raised protrusion terminating at a substantially sharp point, an insulator layer over the raised protrusion sufficiently thin to be breached by a breakdown voltage applied to the sharp point, a region comprised of a material on the insulator over the raised protrusion for becoming electrically coupled to the substrate after the insulator layer is breached by the breakdown voltage, and a contact for supplying the breakdown voltage to the substrate. In a second embodiment, the semiconductor device comprises a substrate having a trough formed in a top surface of the substrate, a relatively thick insulator layer over the top surface of the substrate, a relatively thin insulator layer over the trough that is breached by a breakdown voltage applied to the trough, a region comprised of a material on the relatively thin insulator layer over the trough for becoming electrically coupled to the substrate after the relatively thin insulator layer is breached by the breakdown voltage, and a contact for supplying the breakdown voltage to said substrate.

26 Claims, 20 Drawing Sheets

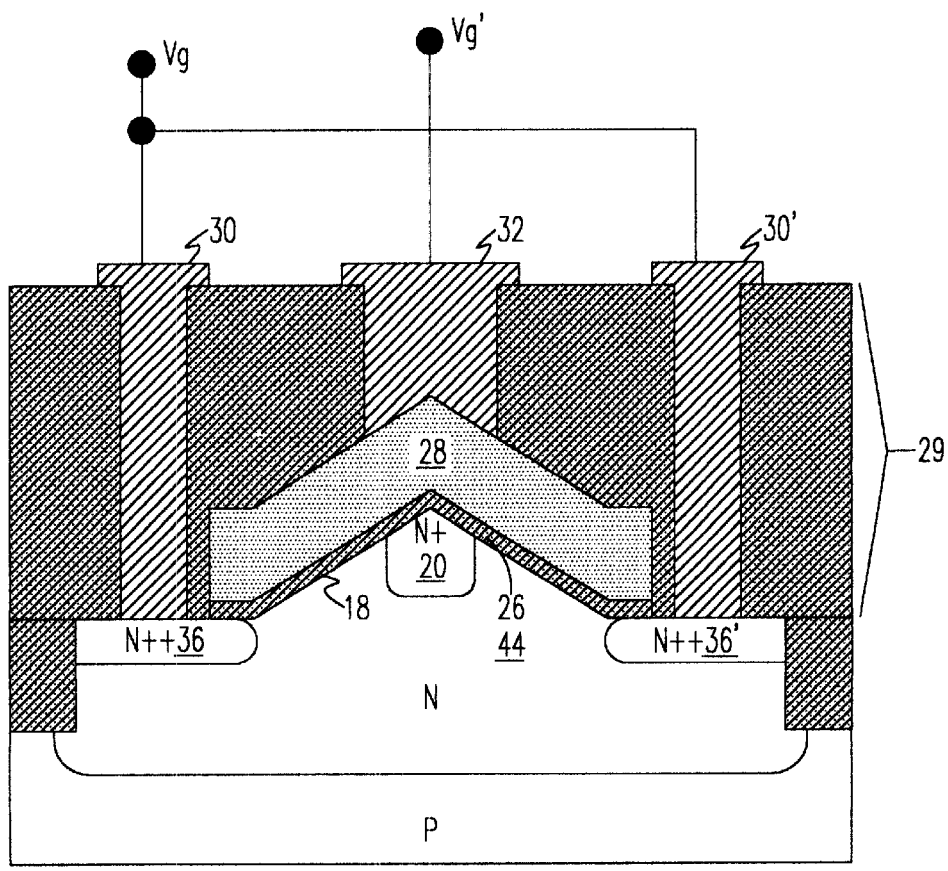
FIG. 4A1

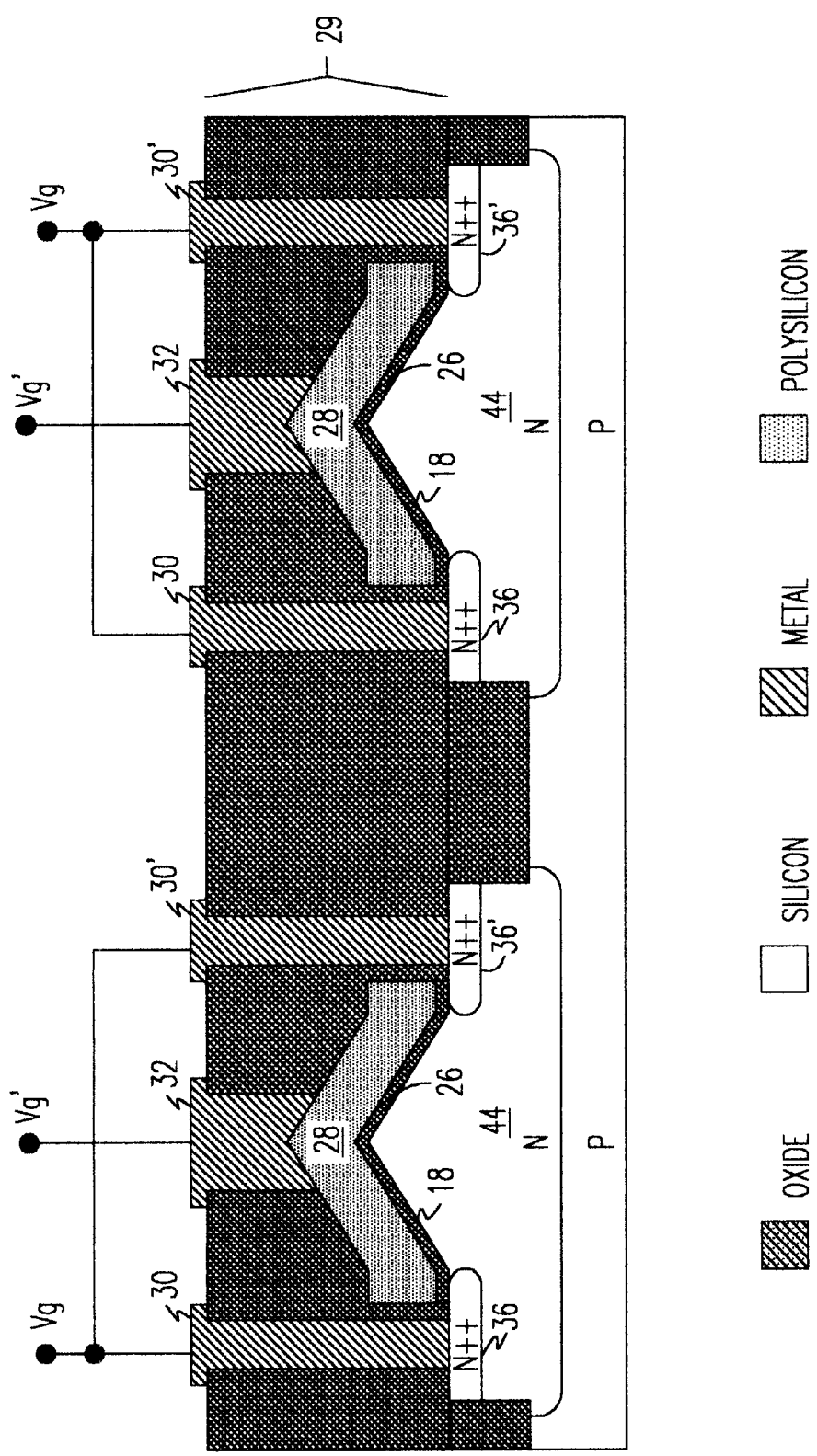
FIG. 4A2

A

B

C

SILICON ANTI-FUSE STRUCTURES, BULK AND SILICON ON INSULATOR FABRICATION METHODS AND APPLICATION

CROSS-REFERENCE TO RELATED APPLICATION

The subject matter of this application is related to the disclosure of co-pending patent application Ser. No. 09/466,479 filed Dec. 17, 1999 for "Methods and Apparatus for Blowing and Sensing Antifuses", and assigned to a common assignee herewith. The disclosure of application Ser. No. 09/466,479 is incorporated herein by reference.

BACKGROUND OF THE INVENTION

1. Field of the Invention

The present invention generally relates to silicon antifuse (AF) structures that will use a field enhanced region having a substantially reduced oxide thickness and, more particularly, to using the reduced oxide thickness to allow AF programming at burn-in voltages which do not damage standard Complementary Metal Oxide Semiconductor (CMOS) logic.

2. Background Description

AF technology through the use of dielectric breakdown is well understood. U.S. Pat. No. 5,250,459, issued to Lee and entitled "Electrically Programmable Low Resistive Antifuse Element" illustrates this concept. In order to ensure AF programming (i.e., in going from a high impedance state to a low impedance state, a dielectric layer between two conductors is damaged, and a conductive filament between the two conductors is formed), the usual practice to form the filament is to damage a gate oxide layer between the two conductors. This presents a problem in that the voltage/current required to program the AF must pass through standard CMOS logic without damaging it. In addition, the voltage must generally be generated on-chip since it cannot be passed through an active electrostatic discharge (ESD) protected pin (which would typically trigger), nor can it pass on a no-connect due to Joint Electron Device Engineering Council (JEDEC) specification limitations. One solution, as described in U.S. Pat. No. 5,691,217, issued to Micron Technology, Inc., and entitled "Semiconductor Processing Method of Forming a Pair of Field Effect Transistors", is to form a pair of field effect transistors having different thickness gate dielectric layers, which is a costly and complicated process.

SUMMARY OF THE INVENTION

It is therefore an object of the present invention to provide silicon structures that will use a field enhanced region where the oxide thickness is substantially reduced to allow AF programming at burn-in voltages which do not damage the standard CMOS logic.

In one embodiment, the structure comprises a substrate that has a raised protrusion terminating at a substantially sharp point, and an insulator over the raised protrusion sufficiently thin to be breached by a breakdown voltage applied to the sharp point. A region comprised of a material is formed on the insulator over the raised protrusion for becoming electrically coupled to the substrate after the insulator is breached by the breakdown voltage. Finally, the structure also has a contact for supplying the breakdown voltage to the substrate.

In a second embodiment, the semiconductor device comprises a substrate having a trough formed in a top surface of the substrate, a relatively thick insulator layer over the top surface of the substrate, and a relatively thin insulator layer over the trough that is breached by a breakdown voltage applied to the trough. A region comprised of a material on the relatively thin insulator layer over the trough is also provided, which becomes electrically coupled the substrate after the relatively thin insulator layer is breached by the breakdown voltage. Finally, a contact is provided for supplying the breakdown voltage to the substrate.

BRIEF DESCRIPTION OF THE DRAWING

The foregoing and other objects, aspects and advantages will be better understood from the following detailed description of a preferred embodiment of the invention with reference to the drawings, in which:

FIG. 4A1 is a cross-sectional side view showing the first embodiment of the AF device after deposition of gate polysilicon;

FIG. 4A2 is a cross-sectional side view showing two adjacent AF devices of the type shown in FIG. 4A1;

DETAILED DESCRIPTION OF A PREFERRED EMBODIMENT OF THE INVENTION

Figure 1:
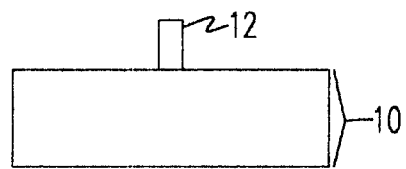
FIG. 1 is a cross-sectional side view of a first embodiment of an AF device, showing a starting wafer with a mask over a silicon tip area.
Figure 1A:
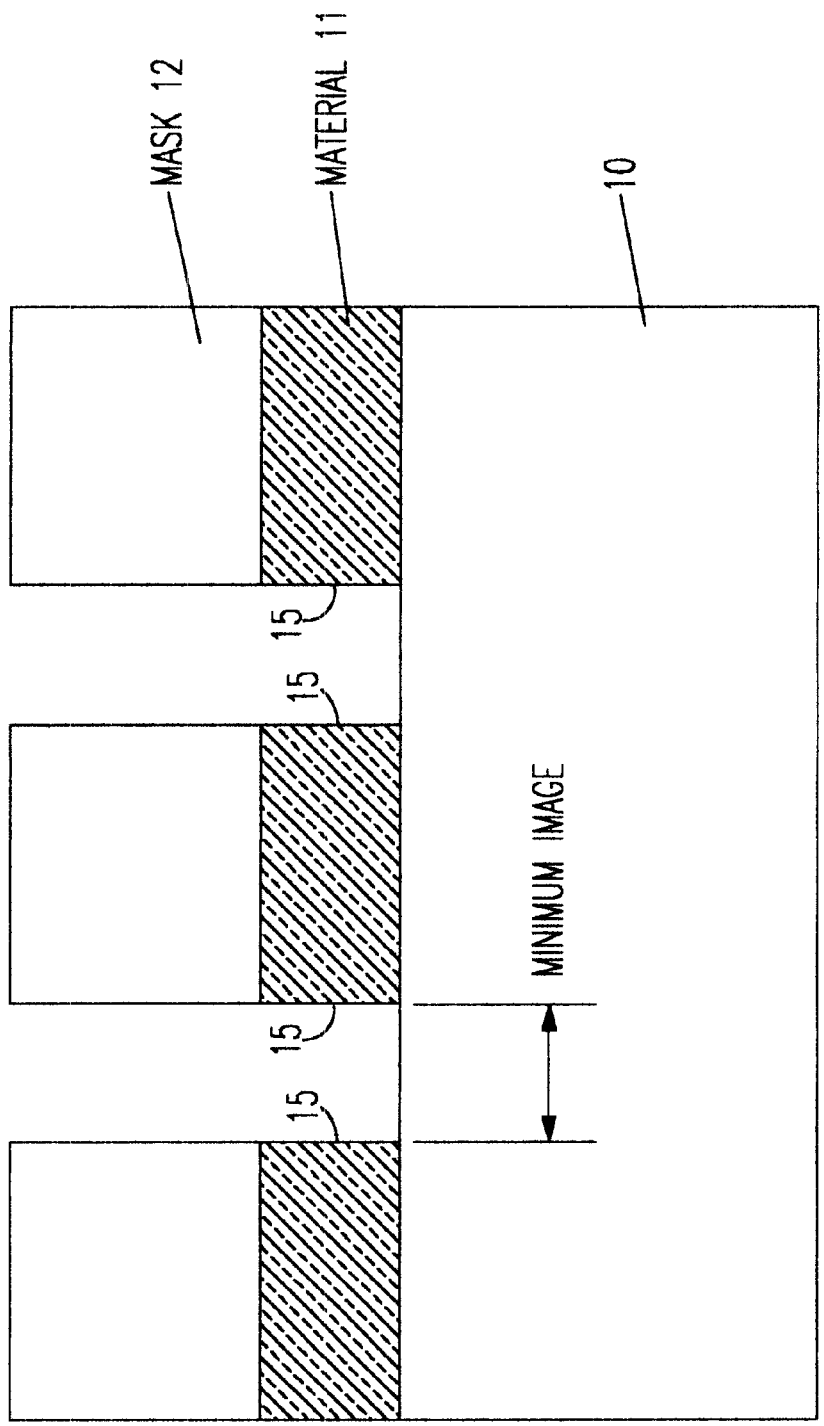
FIGS. 1A, 1B and 1C, taken together, is a cross-sectional side view of the process steps involved in creating a sublithographic mask.
Figure 1B:
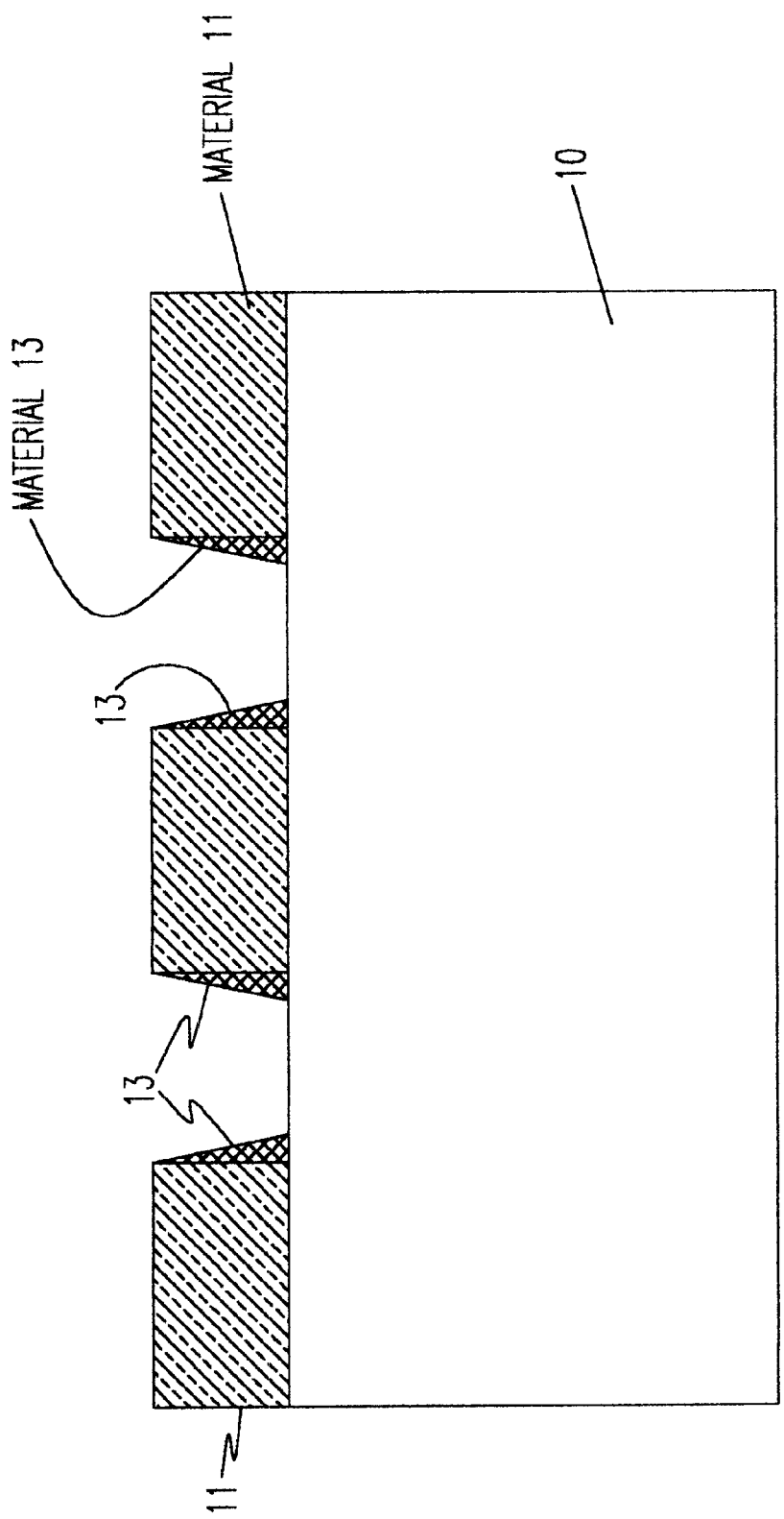
Figure 1C:
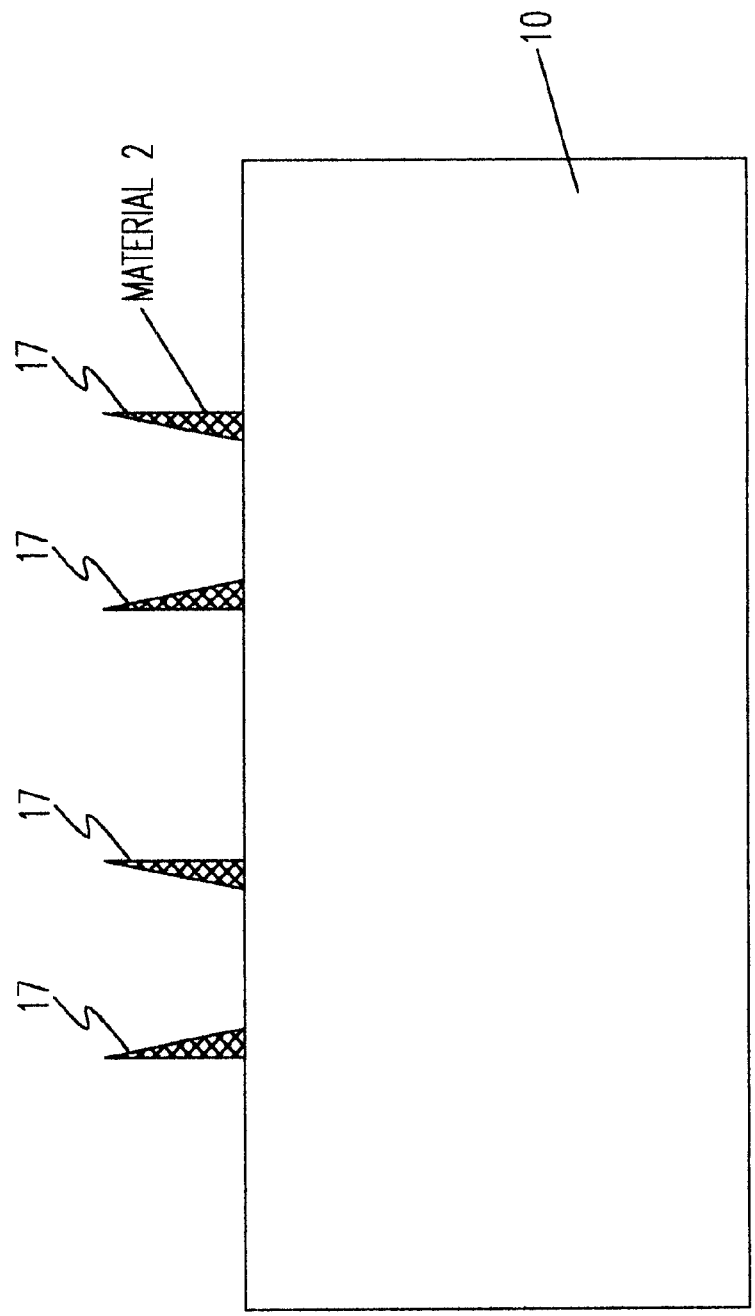

As shown in FIG. 1, a <100> wafer 10 has a mask 12 placed over a portion of the wafer 10. The mask 12 is placed over an area that will eventually form a silicon tip. The mask material may be any suitable material such as, for example, a 20–60 nm nitride. Alternate means of creating a sub-lithographic mask are also feasible, thereby reducing the pitch (i.e., the tip plus space distance) and maximizing tip placement. One such means of producing a sub-lithographic image is shown in FIGS. 1A, 1B and 1C. In FIG. 1A, a mask 12 is used to pattern an oxide material 11, exposing one sidewall 15 for every tip 17 shown in FIG. 1C. In FIG. 1B, a spacer 13, preferably a nitride, is patterned to a sub-lithographic size. Oxide 11 and nitride 13 are chosen such that the etch rate of the oxide 11 is at least 100 times the etch rate of nitride 13. Upon selectively etching the oxide 11, the sub-lithographic mask of the nitride 13 is left, as shown as 17 in FIG. 1C, each of which corresponds to mask 12 shown in FIG. 1.

Figure 2:
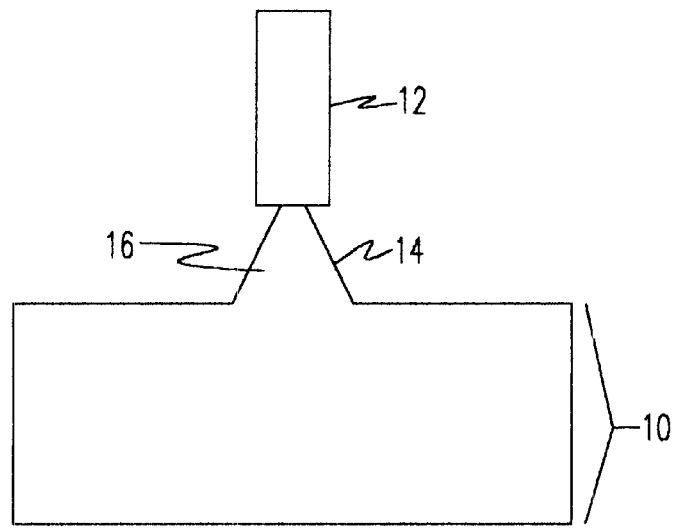
FIG. 2 is a cross-sectional side view of a KOH (potassium hydroxide) etching of silicon.
Figure 3:
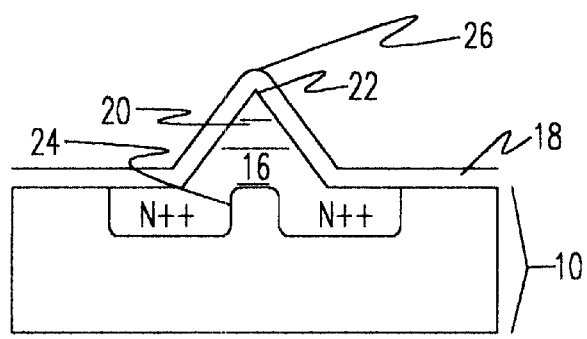
FIG. 3 is a cross-sectional side view of a silicon point sharpening and heavily doped implant.

In FIG. 2, the wafer 10 is etched, preferable with KOH, to expose a <111> facet 14. In FIG. 3, the mask 12 is removed, and oxide 18 is grown. The silicon tip 16 is "sharpened" by this and any subsequent oxidation by using the oxide 18. It is preferred that repetitive oxidation cycles be used to sharpen the tip 16. In a preferred embodiment, the tip oxide 26 final thickness is approximately 20 Å–200 Å, grown in an oxidation process using dry oxygen as the ambient gas, at a temperature of approximately 950° C. or less. The relatively low oxidation temperature results in a sharper tip 22 having oxide 26 thereon, which may be 30–40% thinner than oxide 18. The field enhancement at the tip 22 is typically 20–30% higher as compared to the planar case. An optional implant of $N^+$ 20 under the tip 22 can be used to enhance breakdown, in addition to a standard N-Well isolation implant 24 for P-Type starting silicon.

In FIG. 4A1, N+ type polysilicon or intrinsic polysilicon 28 is deposited and patterned in accordance with conventional methods. Intrinsic polysilicon would become doped later to become N+ polysilicon. Metals widely known to those skilled in the art may also be utilized instead of polysilicon. Oxide layer 29 is deposited, and terminals 30, 30' and 32 connected to junctions 36 and 36', and gate polysilicon 28, respectively, to control the operation of the device, where $V_g$ is the voltage applied to the terminals 30 and 30', and $V_g'$ is the voltage applied to the terminal 32. As shown in FIG. 4A1, it is preferred that voltage be applied via back end of line (BEOL) metal interconnects to the terminals. Terminals 30, 30' and 32 are used as AF programming points with the standard on-chip generated voltages. It is preferred that terminals 30 and 30' are negative in potential with respect to terminal 32, so as to apply the highest field across the tip oxide 26. The structure forms form an electrical connection between terminals 30 and 30', the N++ junctions 36 and 36', and the N-well 44. FIG. 4A2 shows a cross-sectional side view showing two adjacent AF devices of the type shown in FIG. 4A1.

Figure 4B:
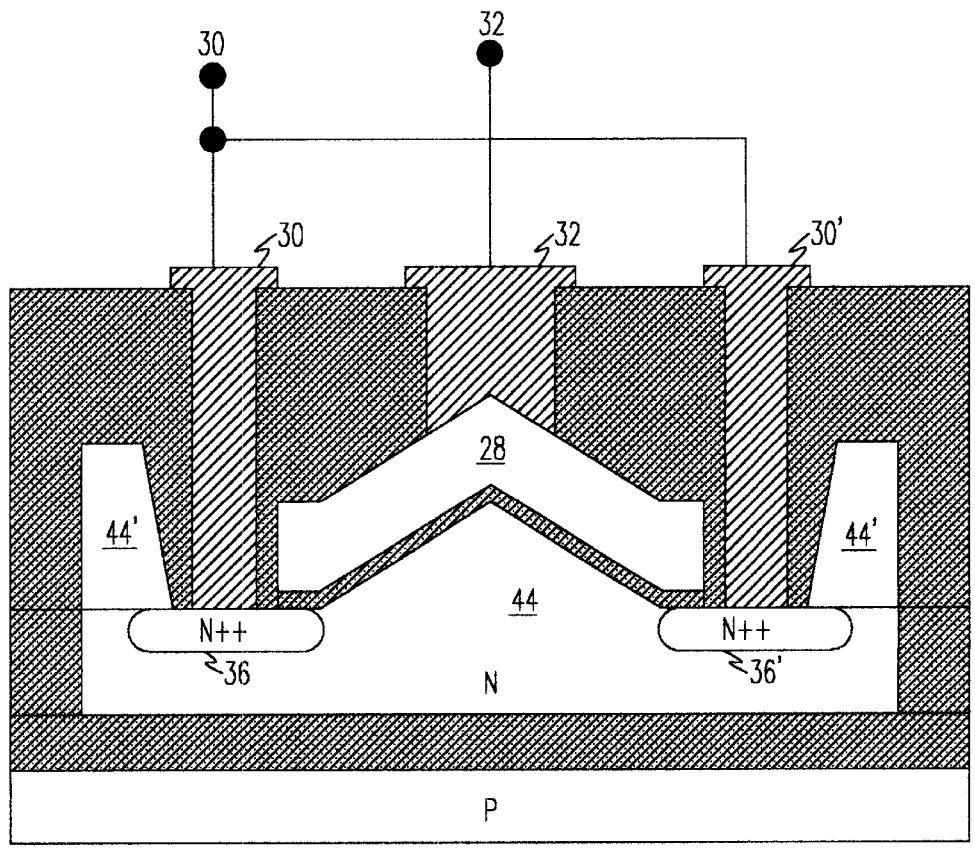
FIG. 4B is a cross-sectional side view showing an alternate embodiment of the AF device shown in FIGS. 4A1 and 4A2.

FIG. 4B shows a cross-sectional side view of an alternate embodiment of the AF device shown in FIGS. 4A1 and 4A2. In particular, FIG. 4B shows silicon structures 44' and 44", which can be formed in accordance with techniques widely known to those skilled in the art.

Figure 4C:
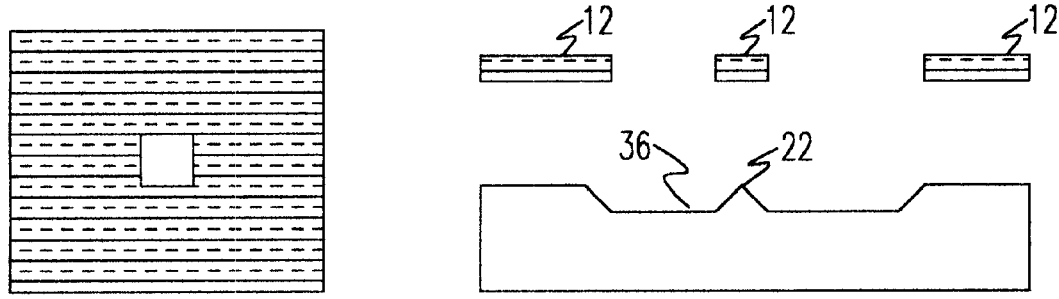
FIG. 4C is a top and plan view of a donut tip mask and embodiment that may be used with chemical-mechanical polishing.

In FIG. 4C, an alternate embodiment to FIG. 4A1 is shown that is compatible with chemical-mechanical processes (CMP). In FIG. 4C, the tip 22 is fabricated in a recessed area 36 by altering the tip etch mask 12 to make a donut shape as shown. Device processing steps similar to the above complete the device. Finally, standard processing through interconnects is done, as discussed in regard to FIG. 4A1. The finished device is shown in FIG. 4B.

Figure 5:
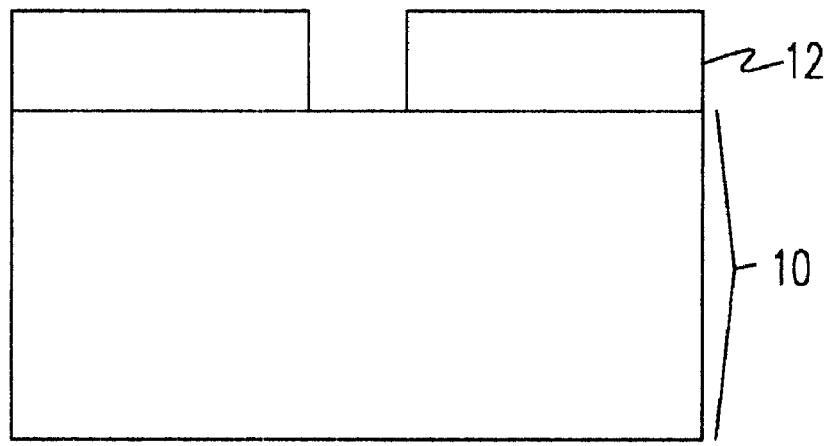
FIG. 5 is a starting cross-sectional side view of a second embodiment of an AF device, showing a starting bulk wafer with a mask.
Figure 6:
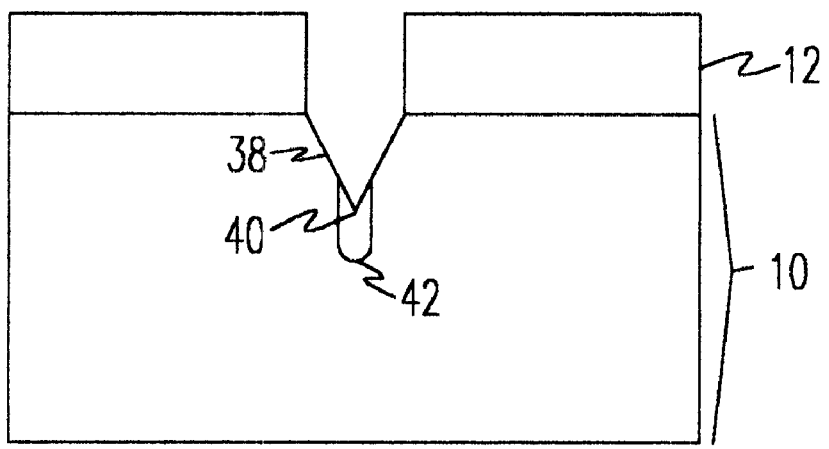
FIG. 6 is a cross-sectional side view of a depression created from etching the structure of FIG. 5.
Figure 7A:
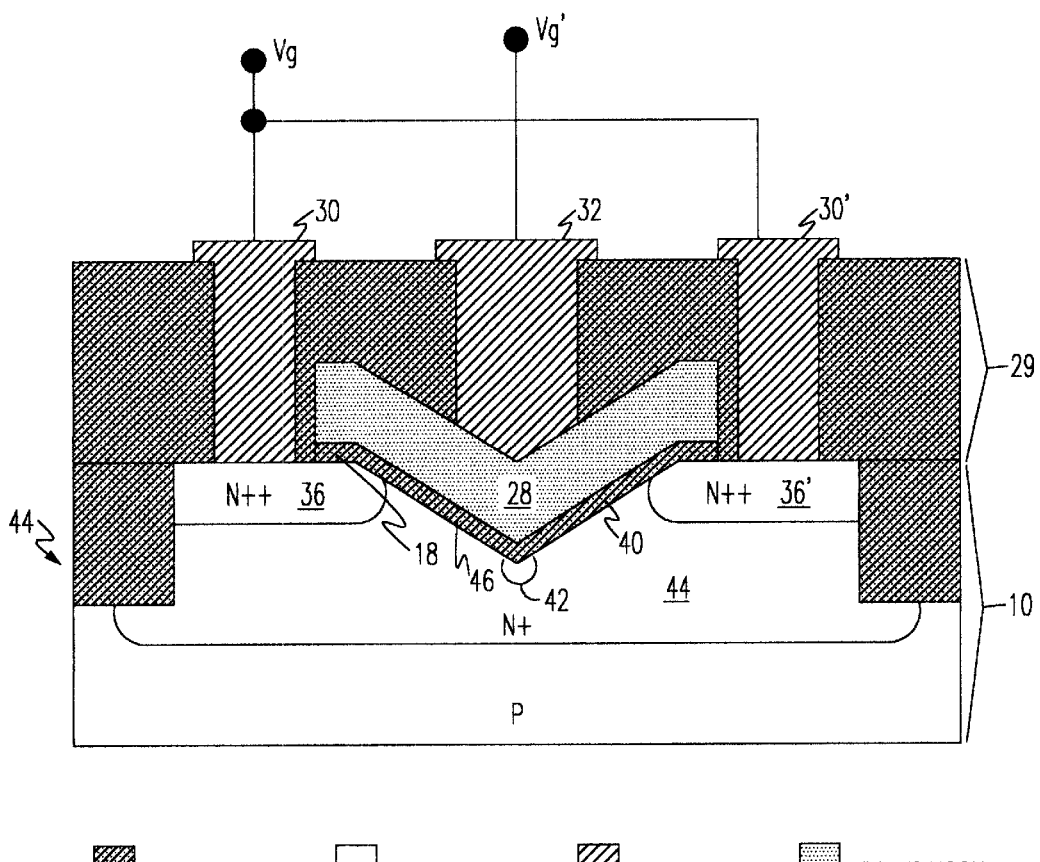
FIG. 7A is a cross-sectional side view showing the second embodiment of the AF device after deposition of gate polysilicon.
Figure 7B:
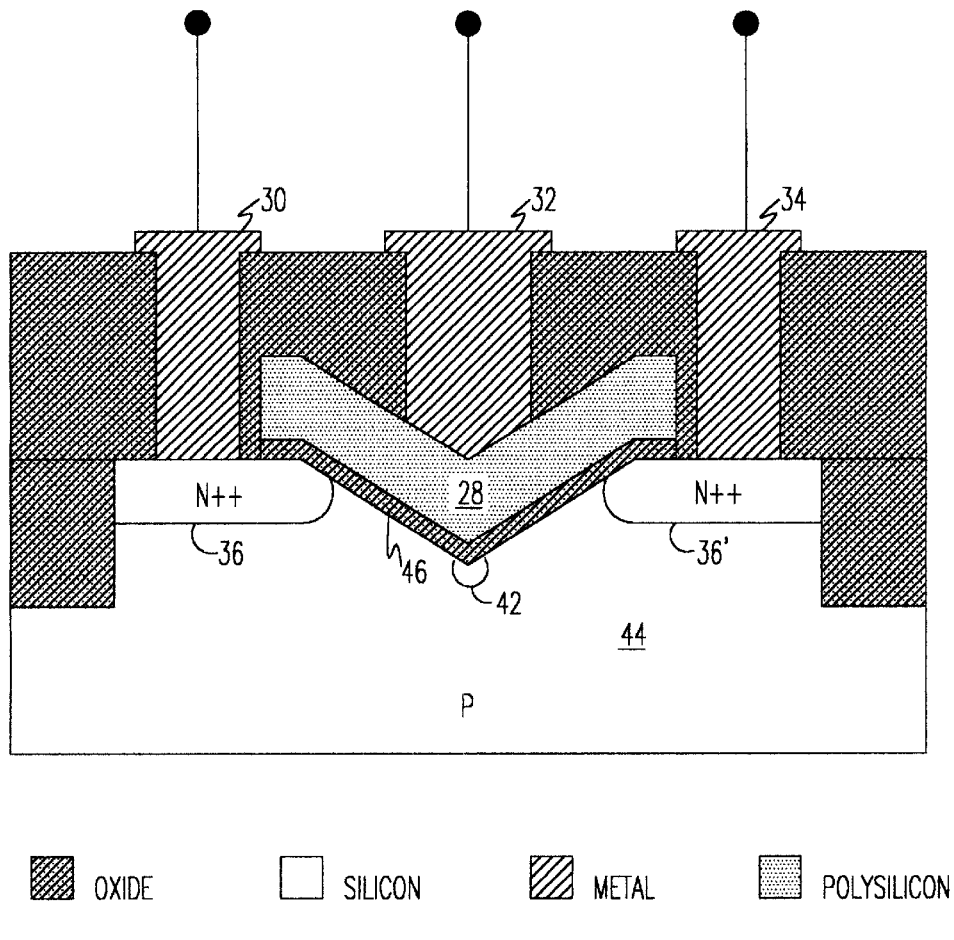
FIG. 7B is a cross-sectional side view of the bulk silicon structure of FIG. 6 which supports operation of the AF as a transistor.

FIGS. 5–7 show the process steps involved with a second embodiment of the invention having an embedded silicon tip. In FIG. 5, a <100> bulk wafer 10 has a mask 12 placed thereon. The mask material may be any suitable material, such as a 20–60 nm nitride. In FIG. 6, the bulk silicon wafer 10 is etched, preferably with KOH, in a self-limiting fashion to create a <111> surface 38, and self limiting bottom point 40 or trough. The structure is shown with an optional N+ junction 42 at the point 40, in an N-well assuming a P-type substrate. It is preferred that the N+ junction 42 be implanted prior to depositing polysilicon 28, shown in FIGS. 7A and 7B. Metals widely known to those skilled in the art may also be used instead of polysilicon. The concentration of KOH is adjusted to give proper etch rate and depth. EDP (Ethylene Diamine Pyrocatechal) can also be used as a <100> etchant, but is not preferred because of its high toxicity. The <100>:<111>etch rate of KOH is 400:1, whereas the <100>:<111>etch rate of EDP is 35:1. Thus, EDP is more easily maskable than KOH. See "Silicon as a Mechanical Material", Kurt E. Petersen, *Proceedings IEEE*, Vol 70, No. 5, pp. 420–457.

FIG. 7A depicts the bulk silicon structure 10 wherein gate polysilicon 28 is deposited and patterned, and oxide 46 is grown as previously described. An oxide layer 29 is deposited, and terminals 30, 30' and 32 connected to junction 36 and 36', and gate polysilicon 28, respectively, to control the operation of the device, where $V_g$ is the voltage applied to the terminals 30 and 30', and $V_g'$ is the voltage applied to the terminal 32. As shown in FIG. 7A, it is preferred that voltage be applied via BEOL metal interconnects to the terminals. Junctions 36 and 36' are implanted, and terminals 30, 30' and 32 are used as AF programming points using standard on-chip generated voltages. It is preferred that terminals 30 and 30' be used to apply voltage, and that terminal 32 be grounded, so as to apply the highest voltage across the oxide 46 located on the tip 40. The structure forms form an electrical connection between terminals 30 and 30', the N++ junctions 36 and 36', and the N-well 44.

The oxide 46 final thickness, preferably grown in a low temperature oxidation process, may be 30–40% thinner than the oxide shown at 18. The field enhancement at the tip 40 is typically 20–30% higher as compared to the planar case. Terminals 30, 30' and 32 connected to junctions 36 and 36', and gate polysilicon 28, respectively, control the operation of the device, where $V_g$ is the voltage applied to terminal 30 and 30', and $V_g'$ is the voltage applied to terminal 32. Terminals 30, 30' and 32 are thus used as AF programming points with the standard on-chip generated voltages. FIG. 7B is an alternate embodiment of FIG. 7A, where independent BEOL interconnects are provided to each of terminals 30, 32 and 34.

Figure 8:
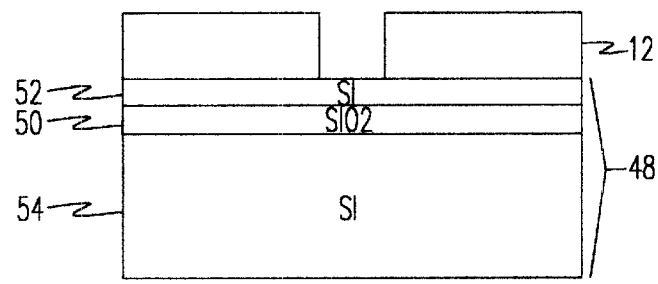
FIG. 8 is a cross-sectional side view of a mask on a starting Silicon-on-Insulator (SOI) wafer of a third embodiment of an AF device.
Figure 9:
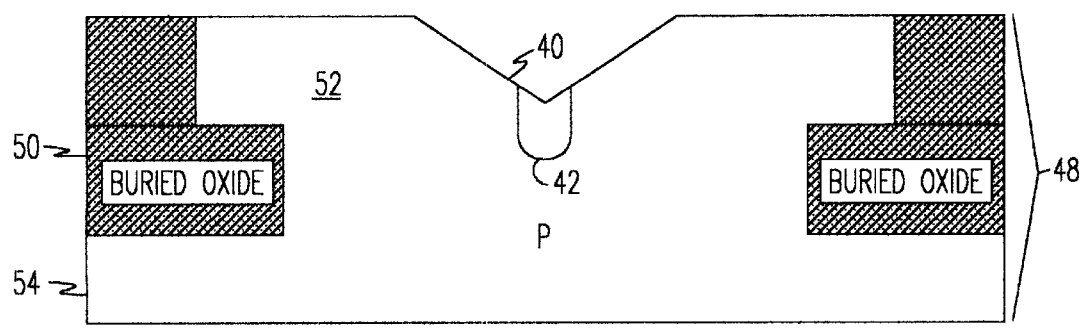
FIG. 9 is a cross-sectional side view of a depression created from etching the SOI structure of FIG. 8.

As shown in FIGS. 8–10, the silicon tip may also be fabricated in SOI 48 technology. In FIG. 8, buried silicon dioxide (BOX) layer 50 provides ohmic contact for the AF blow path. A mask 12 is placed on active silicon layer 52. Active silicon layer 52 is first etched, and then BOX layer 50 is etched These etches can also expose the contact to the bulk silicon 54 for later connection to an N-well 44, assuming a P-type substrate. If desired, an etch can first be done to open the underlying bulk silicon 54, epitaxial silicon grown to fill the space previously occupied by the BOX layer 50, and subsequent self-limiting etching, preferable using KOH, can be used to create a <111> surface with a self limiting bottom point 40 or trough, as shown in FIG. 9. FIG. 9 also shows the optional N+ junction 42 at the point 40.

Figure 10A:
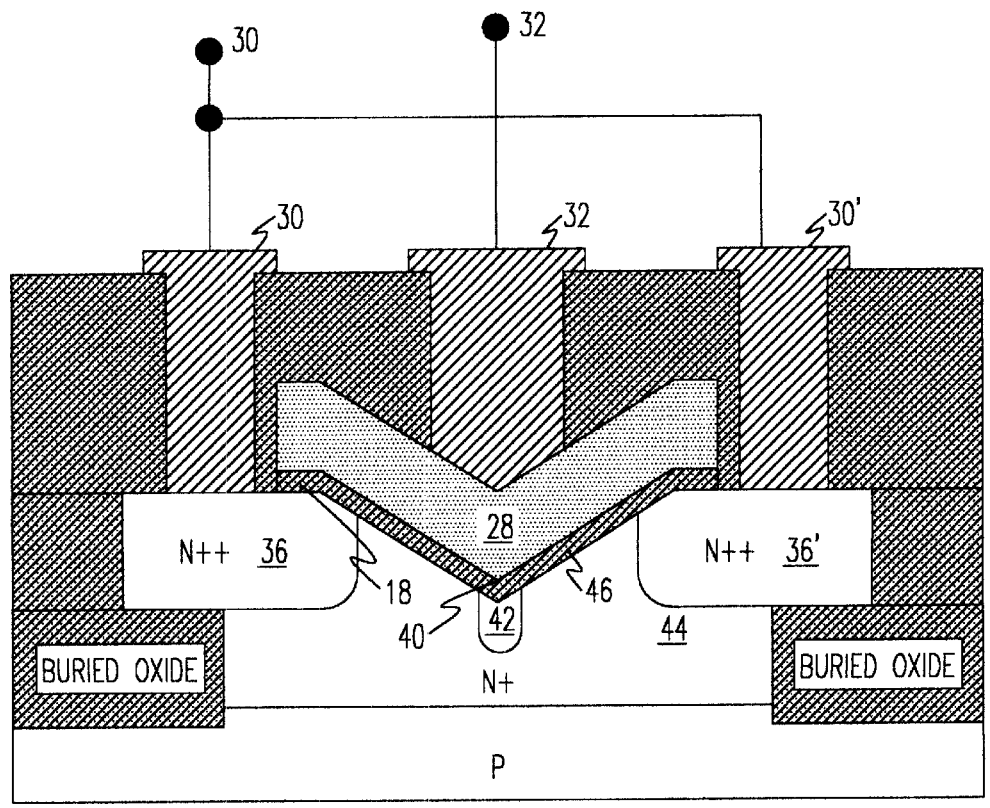
FIG. 10A is a cross-sectional side view of the SOI structure of FIG. 9 when gate polysilicon is deposited.

As shown in FIG. 10A, after etching is completed, it is preferred that oxide 46 is grown, as previously discussed with regard to FIGS. 3 and 7A. Junctions 36 and 36' are then implanted within the N-well 44. It is preferred that this be a high energy implantation when the oxide 18 is grown, which could be defined without an extra mask, but would require a separate implant as compared to bulk. As previously discussed, an optional N+ junction 42 at the point 40 can be formed.

N+ doped polysilicon 28, or a metal widely known to those skilled in the art, is patterned, and standard well and gate contact points are used as AF programming points using standard on-chip generated voltages. Terminals 30, 30' and 32 are connected to junction 36 and 36', and gate polysilicon 28, respectively, to control the operation of the device, where $V_g$ is the voltage applied to the terminals 30 and 30', and $V_g'$ is the voltage applied to the terminal 32. Terminals 30, 32 and 30' are used as AF programming points with the standard on-chip generated voltages. As seen, it is preferred that voltage be applied via BEOL metal interconnects to the terminals. It is preferred that terminals 30 and 30' be used to apply voltage, and that terminal 32 be grounded, so as to apply the highest voltage across the gate oxide 46 located on the tip 40. As seen, the structure forms form an electrical connection between terminals 30 and 30', the N++ junctions 36 and 36', and the N-well 44.

In a practical implementation in SOI, the bulk material dopant can be independently chosen to minimize additional mask/implant steps for the outer plate connection. The tip oxide final thickness 46, preferably grown in a low temperature oxidation process, as described with regard to FIGS. 3 and 7A, may be 30–40% thinner then the gate oxide 18. The field enhancement at the tip is typically 20–30% higher as compared to the planar case. Finally, contact to bulk AF plate or common backside connection is made and, as in previous embodiments, standard processing through interconnects is done.

Figure 10B:
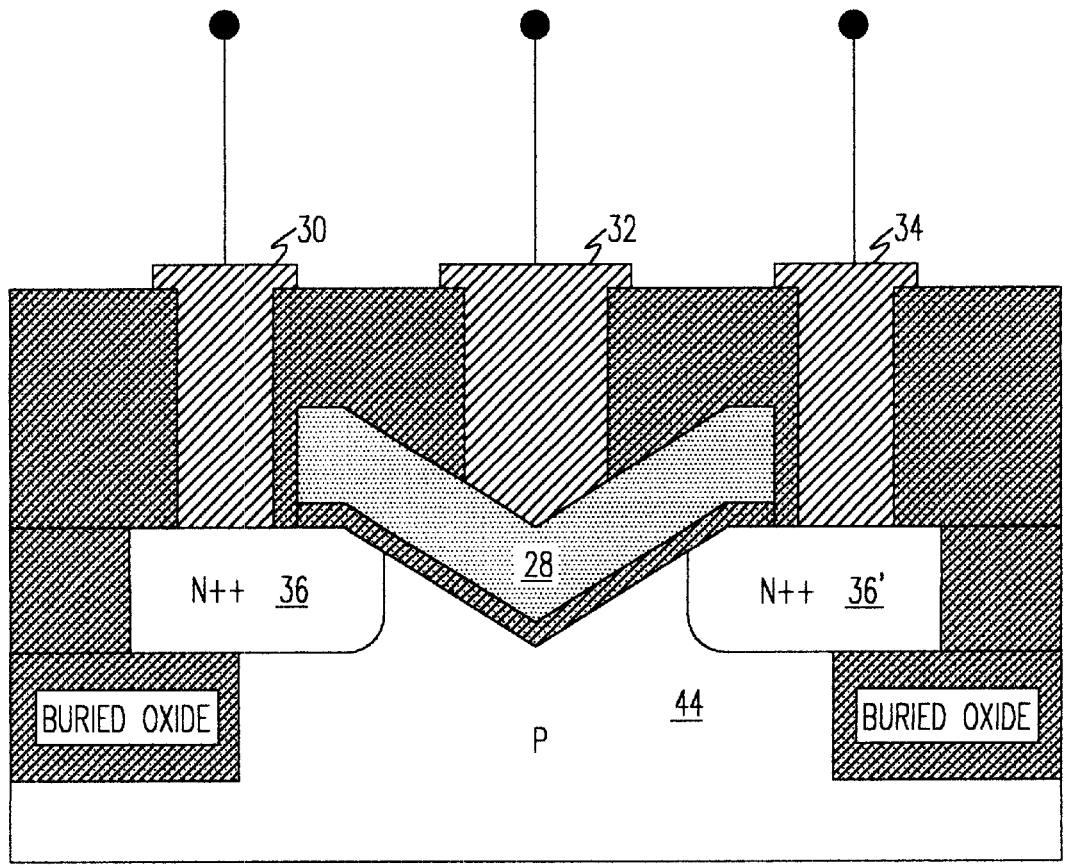
FIG. 10B is a cross-sectional side view of an alternate embodiment of FIG. 10A that supports operation of the AF as a transistor.

In an alternate embodiment of the SOI trench AF structure shown in FIG. 10B, independent BEOL interconnects are provided to each of terminals 30, 32 and 34. FIG. 10B supports the operation of the AF as a transistor, corresponding to the application shown in FIGS. 15 and 16.

Figure 10C:
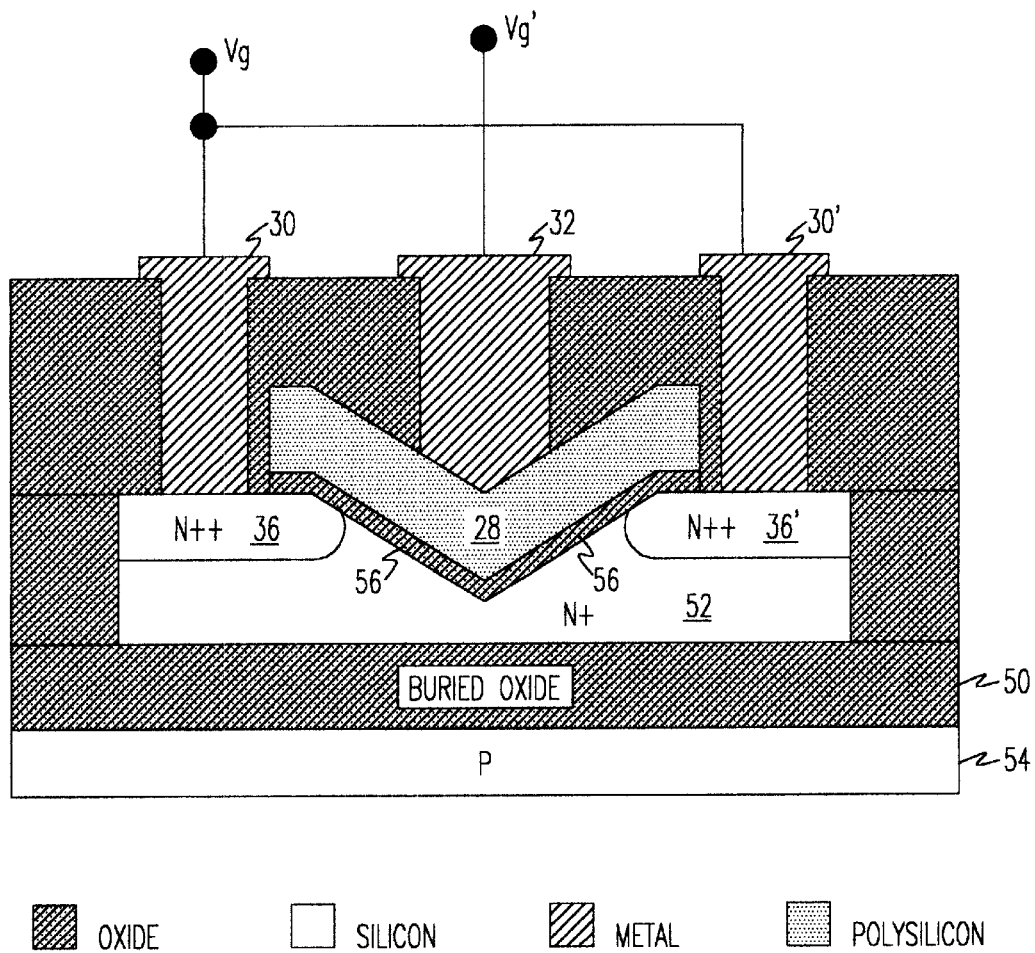
FIG. 10C is a cross-sectional side view of an alternate embodiment of the SOI structure of FIG. 9 where the AF is built into the active region.

FIG. 10C is an alternate embodiment of FIG. 10A, where the mask shape for the trench is sized so that the V-shaped trench 56 formed is less deep than the BOX layer 50, terminating in active silicon layer 52. Any optional doping steps, done in accordance with conventional processing, necessary to reduce bulk contact resistance would be made prior to the BOX layer polysilicon gate formation.

Figure 10D:
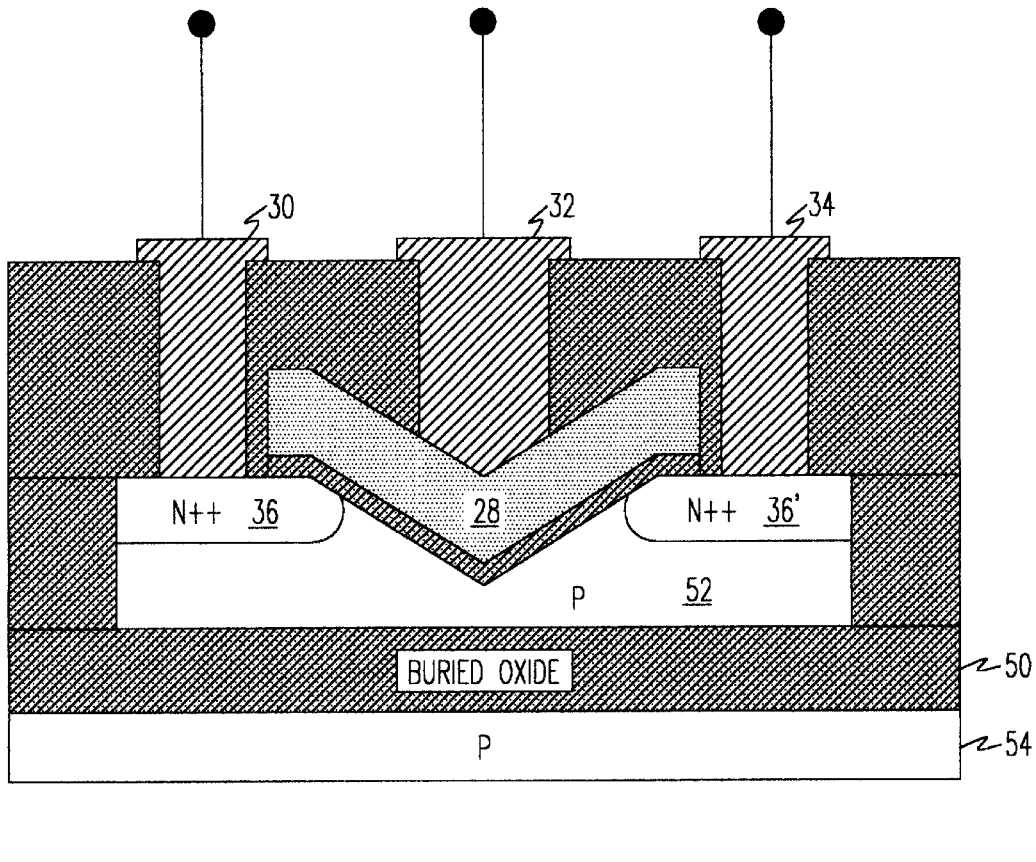
FIG. 10D is a cross-sectional side view of an alternate embodiment of FIG. 10C that supports operation of the AF as a transistor.

FIG. 10D is a variation of FIG. 10C, where independent BEOL interconnects are provided to each of terminals 30, 32 and 34. FIG. 10B supports the operation of the AF as a transistor, to correspond to the application shown in FIGS. 15 and 16.

Figure 11:
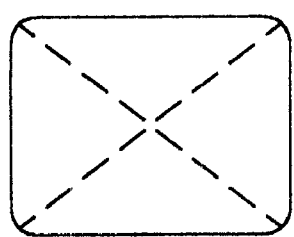
FIG. 11 is a top view showing the various types of tip structures that can be fabricated.
Figure 11:
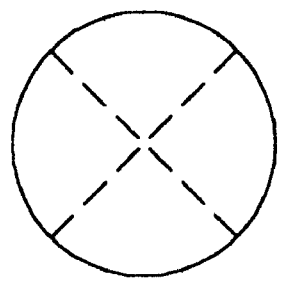
Figure 11:
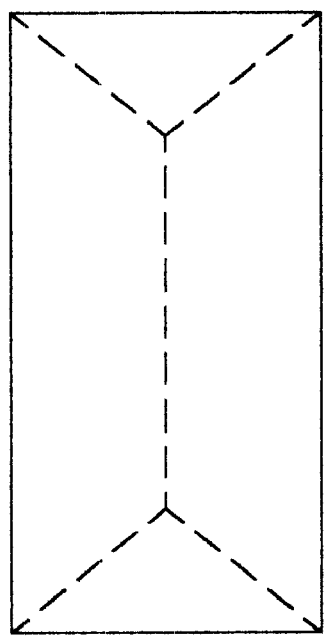

FIG. 11 is a top down view of a schematic indicating the various type of tip structures corresponding to, for example, number 26 in FIG. 4A2 that can be fabricated. Each of the three tip structures shown in FIG. 11 can be utilized with each of the tip-up embodiment (FIGS. 1–4), the tip-down embodiment (FIGS. 5–7), and the SOI embodiment (FIGS. 8–10), depending on the particular application and purpose.

Figure 12:
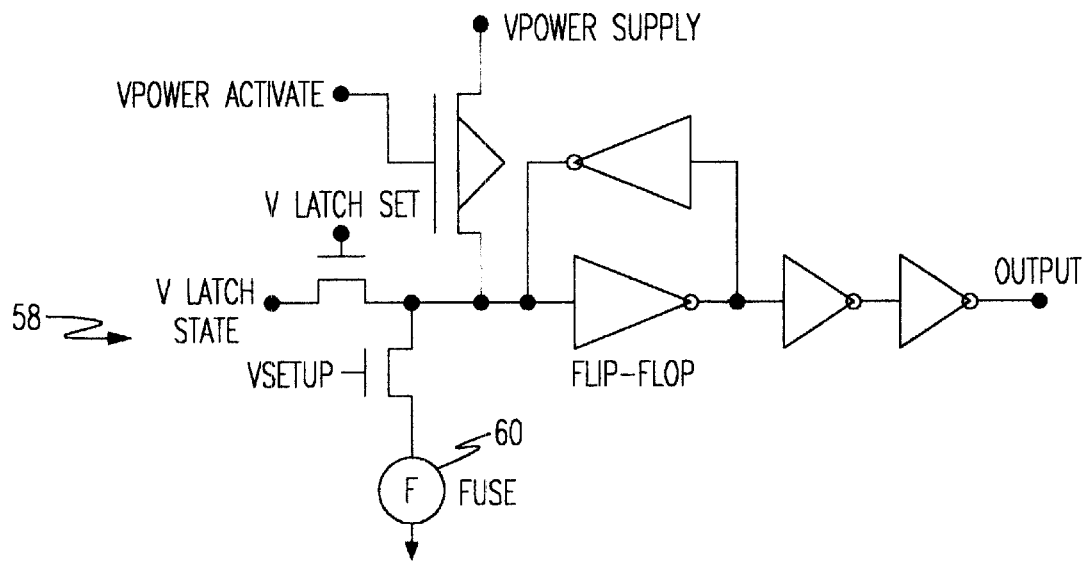
FIG. 12 shows a schematic of a prior art conventional latch.

FIG. 12 shows a prior art conventional latch 58. In prior art conventional latches, a fuse may be written (i.e., programmed, or "blown") with lasers, or an electrically blown fuse or AF may also be used. The flip-flop is set based on the state of the fuse 60. At power up, the latch 58 is preset. Then the state of the fuse (or AF) 60 is sensed, and the latch 58 is set. FIG. 12 uses a two terminal AF (shown in FIGS. 4A1, 4B, 7A, 10A and 10C) as the element to be sensed. The two terminal AF element of FIG. 7A for bulk silicon technology and FIGS. 10A and 10C for SOI technology can be used as enhanced AFs in prior art latches to reduce breakdown voltages and provide other benefits. Latches are sensitive to alpha particles. If an alpha particle changes the state of the flip-flop, the latch goes to the opposite state. In a Dynamic Random Access Memory (DRAM), this can mean, for example, that an address that has been replaced by a spare element is now connected to the bad address. A memory error can stop the system which can only be recovered by shutting off the power, then turning the power back on, and going through the preset, sense, set latch operation.

Changing the AF device from a two terminal device to a three terminal device (shown in FIGS. 7B, 10B and 10D) having an AF structure integrated with an N-type Metal Oxide semiconductor (NMOS) device (AF/NMOS device) permits the integration of the programming, sense select, and latching circuits into one modified latch as described below. The three terminal devices of FIG. 7B, 10B and 10D can be integrated into a latch to make it alpha particle insensitive. These combined AF/NMOS devices can be integrated into a conventional latch to make it alpha particle insensitive.

Figure 13:
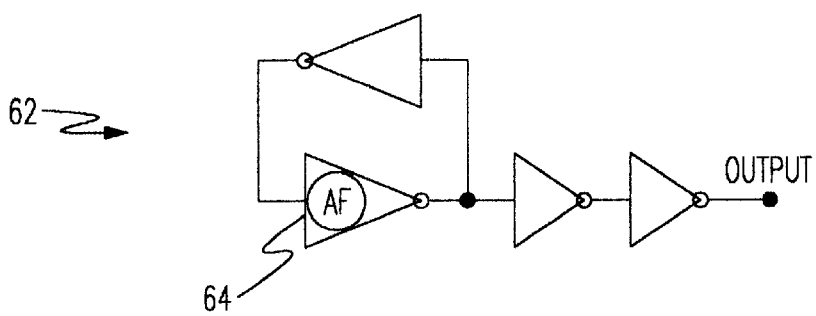
FIG. 13 shows a schematic of an alpha particle insensitive latch.

FIG. 13 shows a schematic of an alpha particle insensitive latch 62. The latch 62 is designed to power up to a preferred state. The AF 64 has been integrated as part of the AF gate. The width/length (W/L) ratio of the flip-flop devices are selected so that the latch 62 goes to a specific state when power is turned on. An alpha particle disturbance will not change the state of the flip-flop. If the AF 64 has not been written, then the output is a high voltage. If the AF 64 has been activated connecting the gate to the channel region with a resistor (resistor is the written AF characteristic, typically in the range of 5,000 to 15,000 ohms), then the output voltage of the latch will be a low voltage.

Figure 14A:
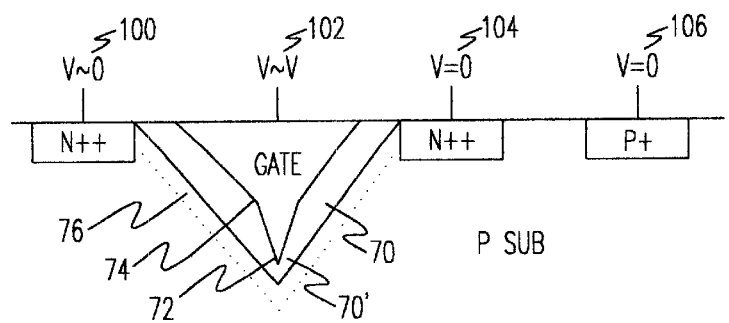
FIG. 14A shows a schematic of an AF device integrated into a gate.
Figure 14B:
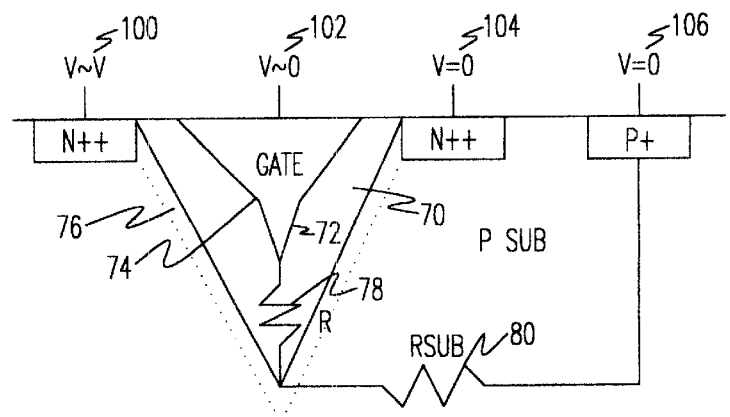
FIG. 14B shows a schematic of an AF integrated into a gate with a resistance from the gate to the channel region.

FIGS. 14A and 14B show a schematic of an AF, integrated into a gate which has not been written (i.e., the AF integrated in the gate is not activated), and which has been written, respectively. In reference to FIG. 7A, the N+ junction 42 retards the oxidation growth in the tip region 74, to create a cusp 72 in the tip oxide 70, thereby further enhancing the field, and providing the most likely place of AF programming. The oxide thickness 70' in near the N+ junction 42 is typically 30% to 40% thinner than the nominal oxide thickness 70.

Figure 15:
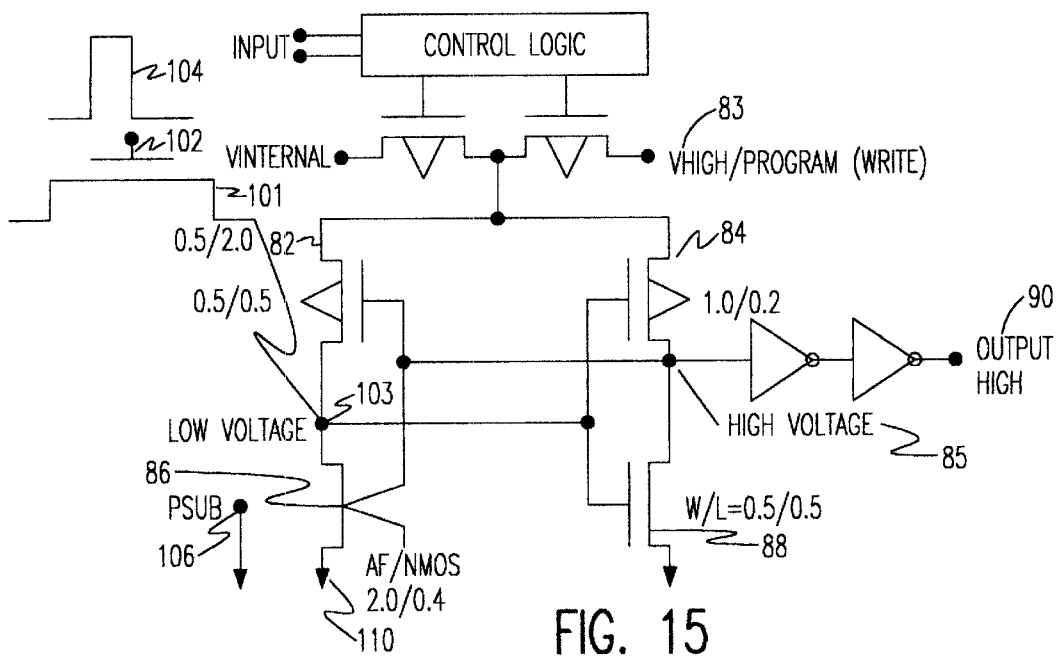
FIG. 15 shows a schematic of the flip-flop and latch state with the AF unactivated.

In FIG. 14A, the gate voltage is on and the channel 76 is formed, preferably at a thickness of 20 Å–200 Å, below the gate 74. The voltages shown (100, 102, 104) are those applied to the device when in the flip-flop used as shown in FIG. 15. In FIG. 14B, there is a resistance 78 from the gate 74 to the channel 76, in series with the substrate resistance to ground 80. The gate 74 is held at V~0, keeping the AF/NMOS device off. Note that the AF can be written (e.g., the oxide blown) because channel 76 causes the gate voltage to be applied across the thin oxide region 70'. There is no depletion capacitance in series to reduce the effects of the applied gate voltage.

FIG. 15 shows the flip-flop and latch state with the AF of the AF/NMOS device unprogrammed (AF portion of AF/NMOS unchanged), corresponding to FIG. 14A. The shown W/L ratio of the transistors 82, 84, 86, 88 are chosen to ensure that the gate of the AF/NMOS is high in voltage and that the channel is on. Specifically, transistors 84 and 86 are much stronger than transistors 82 and 88, with transistors 84 and 86 on when the flip-flop is powered up In a preferred embodiment, Vhigh/program 85 varies between 1 and 5 volts. The latch will have a high output voltage 90. In this state, devices 86 and 84 are "on" and devices 82 and 88 are "off". An alpha particle hit will leave the latch unchanged. If the control logic increases the flip-flop voltage to the write (program) voltage, the AF will blow and create a resistive connection to the substrate, and the latch will go to the opposite state.

Figure 16:
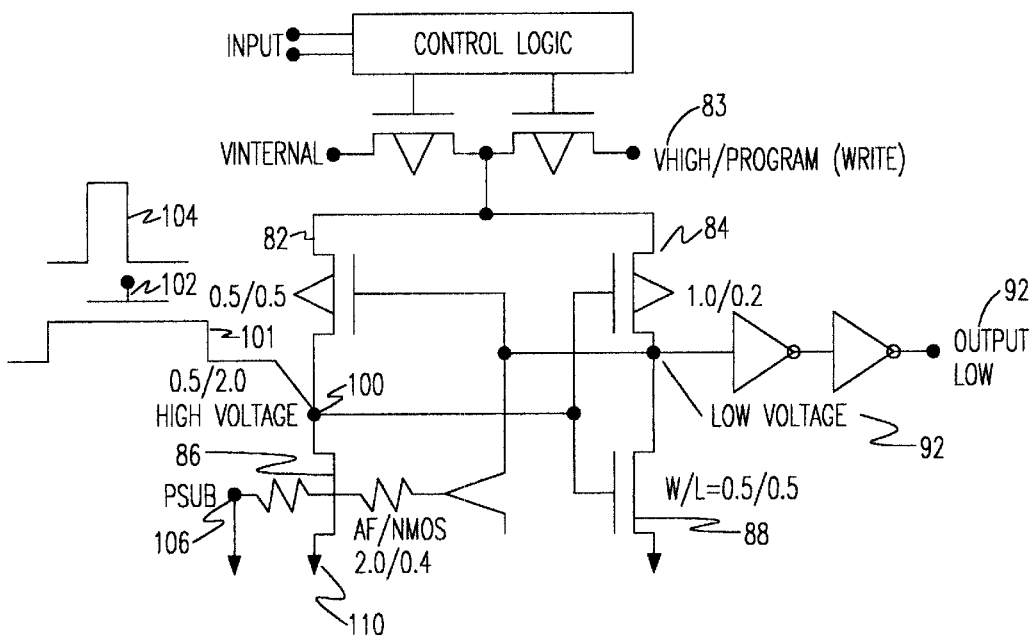
FIG. 16 shows a schematic of the flip-flop of FIG. 15 after the AF has been activated.

FIG. 16 shows the flip-flop after the AF has been activated, corresponding to FIG. 14B. After writing the AF, the voltage 92 across the gate of the AF/NMOS is low as can be seen from the flip-flop state. This means that there is no current flow through the resistances connecting the gate of the AF/NMOS device to ground. In this state the programmed AF portion of the AF/NMOS device holds the gate to substrate potential, which may be connected to ground. The resistive path to ground (500 to 10,000 ohms, for example) will hold the gate portion of the integrated AF/NMOS device at ground and no path is formed between node 100 and the common node 110. In this state, device 82 is holding node 112 to high voltage, with device 84 "off" an device 88 "on".

The latch described in FIGS. 15 and 16 is designed to always have a high output voltage when the three terminal AF device 86 is unprogrammed as shown in FIG. 15 and to always have a low output voltage when the three terminal AF device 86 is programmed as shown in FIG. 16. This is accomplished by designing an unbalanced latch as shown by the width to length (W/L) value of FIGS. 15 and 16. The latch states will therefore be in the states shown in FIGS. 15 and 16 after power is applied to the chip. It is possible, although rare, that noise and other spurious events during power-up of the chip may leave the state of the latch in FIG. 15 in the opposite state (output 90 low instead of high) for intervals of time exceeding the allowed power up time. To ensure this can not occur, a device may be added which will discharge the capacitance of node 103 and thus ensure that the latch will always be in the high output 90 voltage state (FIGS. 15 and 16). The device 101 has minimum width and long channel length (a high impedance device). A pulse is applied to gate 102 to briefly discharge node 103 after power supplies have stabilized during the power up stage. The pulse typically will be of one or a few microseconds duration and will be determined by the time constants of the device/latch combination.

In the case of FIG. 16, the AF/NMOS device has been programmed. The flip flop will temporarily have an output state high when the device 101 is pulsed. However, the latch will return to a low output state when the pulse ends because the latch cannot sustain any other state with the AF portion of the AF/NMOS device programmed with a resistive connection between the gate and a grounded substrate.

The addition of the pulsed device 101 to the integrated flip flop/AF structure as shown in FIGS. 15 and 16 further ensures that the flip flop is powered up to the correct state at time zero. The alpha particle latch immunity can be reduced even further by pulsing device 101 between memory operating cycles to ensure the restoration of the flip flop to the preferred states based on the condition of the AF/NMOS device.

While the invention has been described in terms of a single preferred embodiment, those skilled in the art will recognize that the invention can be practiced with modification within the spirit and scope of the appended claims.

Having thus described our invention, what we claim new and desire to secure by letters patent is as follows:

1. A semiconductor device comprising:
   a substrate comprising a raised protrusion terminating at a substantially sharp point;
   an insulator layer over the raised protrusion sufficiently thin to be breached by a breakdown voltage applied to the sharp point;
   a region comprised of a material on the insulator over the raised protrusion for becoming electrically coupled to said substrate after said insulator layer is breached by the breakdown voltage; and
   a contact for supplying the breakdown voltage to said substrate.

2. The semiconductor device as recited in claim 1, wherein the material on the insulator layer is polysilicon.

3. The semiconductor device as recited in claim 1, wherein the material on the insulator layer is a metal.

4. The semiconductor device as recited in claim 1, further comprising an N+ implant under the raised protrusion.

5. The semiconductor structure as recited in claim 2, wherein said substrate further comprises a plurality of semiconductor devices, and wherein said insulator layer is sufficiently thin and the protrusion sufficiently sharp so that the breakdown voltage breaches said insulator layer without damaging a substantially thicker insulator layer of neighboring semiconductor devices.

6. The semiconductor structure as recited in claim 1, wherein said substrate further comprises a plurality of semiconductor devices, and wherein said insulator layer is sufficiently thin and the protrusion sufficiently sharp so that the breakdown voltage breaches said insulator layer without damaging a thicker insulator layer outside of the region of protrusion.

7. A semiconductor device comprising:
   a substrate having a trough formed in a top surface of said substrate, the trough terminating at a substantially sharp point within said substrate;
   a relatively thin insulator layer over the trough, said relatively thin insulator layer being contiguous with a relatively thick insulator layer of neighboring semiconductor devices, and wherein said relatively thin insulator layer is sufficiently thin to be breached by a breakdown voltage applied to the trough;
   a region comprised of a material on the relatively thin insulator layer over the trough for becoming electrically coupled to said substrate after said relatively thin insulator layer is breached by the breakdown voltage; and a contact for supplying the breakdown voltage to said substrate.

8. The semiconductor device as recited in claim 7, wherein the material on the relatively thin insulator layer is polysilicon.

9. The semiconductor device as recited in claim 7, wherein the material on the insulator layer is a metal.

10. The semiconductor device as recited in claim 8, wherein the top surface of said substrate further comprises a plurality of semiconductor devices, and wherein the breakdown voltage does not breach said relatively thick insulator layer.

11. The semiconductor device as recited in claim 7, further comprising an N+ implant under the substantially sharp point.

12. The semiconductor device as recited in claim 7, wherein the top surface of said substrate further comprises a plurality of semiconductor devices, and wherein said relatively thin insulator is sufficiently thin and the protrusion sufficiently sharp so that the breakdown voltage breaches said relatively thin insulator layer without damaging said relatively thick insulator layer.

13. A semiconductor device comprising:
   a substrate having a buried oxide;
   a trough having at least a portion thereof formed in a top surface of said substrate, the trough terminating at a substantially sharp point;
   a relatively thin insulator layer over the trough, said relatively thin insulator layer being contiguous with a relatively thick insulator layer of neighboring semiconductor devices, and wherein said relatively thin insulator layer is sufficiently thin to be breached by a breakdown voltage applied to the trough;
   a region comprised of a material on the relatively thin insulator layer over the trough for becoming electrically coupled to said substrate after said relatively thin insulator layer is breached by the breakdown voltage; and
   a contact for supplying the breakdown voltage to said substrate.

14. The semiconductor device as recited in claim 13, wherein the trough terminates within the top surface of said substrate.

15. The semiconductor device as recited in claim 13, wherein the trough terminates within an epitaxially regrown silicon region within a region previously grown by the buried oxide.

16. The semiconductor device as recited in claim 13, further comprising an N+ implant under the substantially sharp point.

17. The semiconductor device as recited in claim 15, wherein the top surface of said substrate further comprises a plurality of semiconductor devices, and wherein said relatively thin insulator is sufficiently thin and the protrusion sufficiently sharp so that the breakdown voltage breaches said relatively thin insulator layer without damaging the relatively thick insulator layer.

18. The semiconductor device as recited in claim 13, wherein the material on the relatively thin insulator is polysilicon.

19. The semiconductor device as recited in claim 13, wherein the material on the insulator layer is a metal.

20. The semiconductor device as recited in claim 18, wherein the top surface of said substrate further comprises a plurality of semiconductor devices, and wherein said relatively thin insulator is sufficiently thin and the protrusion sufficiently sharp so that the breakdown voltage breaches said relatively thin insulator layer without damaging the relatively thick insulator layer.

21. The semiconductor device as recited in claim 13, wherein the top surface of said substrate further comprises a plurality of semiconductor devices, and wherein the breakdown voltage does not breach said relatively thick insulator layer.

22. A method for fabricating a semiconductor structure, comprising the steps of:
   etching a bulk silicon wafer to form a raised tip on a portion of the wafer;
   sharpening the tip;
   growing a relatively thin layer of oxide on the tip;
   growing a relatively thick layer of oxide on the top surface of the bulk silicon wafer;
   fabricating doped regions in the bulk silicon wafer;
   depositing and patterning polysilicon over the sharpened tip; and
   implanting regions where electrical fuse contacts will be subsequently formed.

23. The method as recited in claim 22, wherein the tip is sharpened by repetitive oxidation cycles.

24. A method of fabricating a semiconductor structure, comprising the steps of:
   etching a silicon wafer having a top layer of silicon, and a buried oxide positioned between the top layer of silicon and a bulk layer of silicon to form a trough extending into the top layer of silicon, the trough terminating at a substantially sharp tip;
   growing a relatively thin layer of oxide on the trough;
   fabricating doped regions in the silicon wafer;
   depositing and patterning polysilicon in the trough; and
   implanting regions where electrical fuse contacts will be subsequently formed and polysilicon contacts.

25. The method as recited in claim 24, wherein the trough terminates within the top layer.

26. The method as recited in claim 24, wherein the trough terminates within the buried oxide.

* * * * *